(12) United States Patent
Sakamoto et al.

(10) Patent No.: US 8,722,840 B2
(45) Date of Patent: May 13, 2014

(54) RESIST UNDERLAYER FILM FORMING COMPOSITION, AND METHOD FOR FORMING RESIST PATTERN USING THE SAME

(75) Inventors: Rikimaru Sakamoto, Toyama (JP); Noriaki Fujitani, Toyama (JP); Takafumi Endo, Toyama (JP); Ryuji Ohnishi, Toyama (JP); BangChing Ho, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/884,132

(22) PCT Filed: Nov. 11, 2011

(86) PCT No.: PCT/JP2011/076083
§ 371 (c)(1),
(2), (4) Date: May 8, 2013

(87) PCT Pub. No.: WO2012/067040
PCT Pub. Date: May 24, 2012

(65) Prior Publication Data
US 2013/0230809 A1    Sep. 5, 2013

(30) Foreign Application Priority Data
Nov. 17, 2010  (JP) .................................. 2010-256457

(51) Int. Cl.
*G03F 7/11*  (2006.01)
*C08L 67/04*  (2006.01)

(52) U.S. Cl.
USPC .......................... 528/99; 430/271.1; 430/323

(58) Field of Classification Search
None
See application file for complete search history.

(56) References Cited

U.S. PATENT DOCUMENTS

| | | | |
|---|---|---|---|
| 6,451,878 B1* | 9/2002 | Fukuzawa et al. | 523/451 |
| 7,632,626 B2* | 12/2009 | Sakamoto | 430/311 |
| 2004/0219456 A1 | 11/2004 | Guerrero | |
| 2009/0321015 A1* | 12/2009 | Kawate et al. | 156/327 |
| 2010/0015550 A1* | 1/2010 | Liu et al. | 430/280.1 |
| 2010/0221657 A1* | 9/2010 | Sakamoto et al. | 430/270.1 |
| 2010/0266951 A1 | 10/2010 | Hiroi et al. | |

FOREIGN PATENT DOCUMENTS

| | | |
|---|---|---|
| JP | 03-50283 A   * | 3/1991 |
| JP | A-2005-352133 | 12/2005 |
| JP | A-2006-501320 | 1/2006 |
| JP | A-2008-015223 | 1/2008 |
| WO | WO 2009/057458 A1 | 5/2009 |
| WO | WO 2009/075265 A1 | 6/2009 |
| WO | WO 2010/061774 A1 | 6/2010 |

OTHER PUBLICATIONS

"Bisphenol S—Wlkipedia, the free encyclopedia", 4 pages downloaded from http://en.wikipedia.org/wiki/Bisphenol_S on Sep. 1, 2013.*
Reg No. 3878-48-1 from CAS Registry and Scifinder database, downloaded Sep. 3, 2013, American Chemical Society, 2 pages.*
Written Opinion of the International Searching Authority Issued in Application No. PCT/JP2011/076083; Dated Jan. 10, 2012.
International Search Report issued in Application No. PCT/JP2011/076083; Dated Jan. 10, 2012 (With Translation).

* cited by examiner

*Primary Examiner* — Cynthia Hamilton
(74) *Attorney, Agent, or Firm* — Oliff PLC

(57) ABSTRACT

There is provided a composition for forming a resist underlayer film that has a high selectivity of dry etching rate even though the composition contains an aromatic ring such as a benzene ring, and that is useful in lowering LER that presents a large problem in EUV (wavelength 13.5 nm) lithography. Moreover, another object is to obtain a composition for forming a resist underlayer film that provides a resist pattern having a desired shape on the resist underlayer film. A resist underlayer film forming composition for lithography which includes a polymer and a solvent, wherein in the polymer, diphenyl sulfone or a derivative thereof is introduced in the main chain of the polymer through an ether bond.

8 Claims, No Drawings

RESIST UNDERLAYER FILM FORMING COMPOSITION, AND METHOD FOR FORMING RESIST PATTERN USING THE SAME

TECHNICAL FIELD

The present invention relates to a composition useful for forming a resist underlayer film between a substrate and a resist film formed thereon in order to obtain a resist pattern having a desired shape in a lithography process in the process of manufacturing semiconductor devices. The present invention also relates to a composition for forming a resist underlayer film that is suitable for the lithography process using EUV exposure.

BACKGROUND ART

As a material for forming a resist underlayer film for EUV exposure, a resist underlayer film forming composition that reduces generation of outgas is disclosed (Patent Document 1). As another disclosure, a resist underlayer film forming composition including a reaction product of a bifunctional diglycidyl ester compound and 2,4-dihydroxybenzoic acid, which is not specified as a material for EUV exposure, is also disclosed (Patent Document 2). However, in Patent Document 1 and Patent Document 2, a two-dimensional polymer obtained by a polyaddition reaction of a bifunctional diglycidyl ester compound and bisphenol S or its derivative is not disclosed and not suggested.

PRIOR ART DOCUMENTS

Patent Documents

Patent Document 1: WO 2010/061774
Patent Document 2: WO 2009/057458

SUMMARY OF THE INVENTION

Problem to be Solved by the Invention

A cross section of a resist pattern formed on the resist underlayer film in a direction perpendicular to a substrate is desirably a rectangular shape. The inventors of the present invention have found from the experience of the inventors that one of the methods for obtaining the rectangular shape is to set an aromatic ring density in the resist underlayer film being high.

The resist underlayer film is required to have higher dry etching rate than that of the resist film (to have higher selectivity of the dry etching rate). However, a resist underlayer film formed from a composition including a polymer being an acrylic resin or a methacrylic resin does not always provide a satisfactory dry etching rate. This is because a bond between carbon atoms with each other constituting the main chain of the acrylic resin or the methacrylic resin (a C—C bond) may not be easily cleaved by dry etching.

In addition, a width of a formed pattern line is 32 nm or less in the case of EUV lithography, and thus, requirement for line edge roughness (hereinafter in this specification, referred to as LER) of side walls of the pattern is strict. When the shape of the formed resist pattern is a tailed shape or a shape of adjacent patterns being not separated but continuous, a value of LER at the time of observation from above the pattern is large. This causes an adverse effect on dimension control. Consequently, it is strongly required that the shape of the resist pattern is set to a rectangular shape having a small LER value.

An object of the present invention is to obtain such a composition for forming a resist underlayer film that has a high selectivity of dry etching rate to a resist film even though the composition contains an aromatic ring such as a benzene ring, and that is useful in lowering LER that presents a large problem in EUV (wavelength 13.5 nm) lithography. Moreover, another object of the present invention is to obtain a composition for forming a resist underlayer film that provides a resist pattern having a desired shape on the resist underlayer film. The composition of the present invention has conditions that the formed resist underlayer film is insoluble in a solvent of the resist applied on the resist underlayer film and that intermixing between the formed resist underlayer film and the resist film does not occur.

Means for Solving the Problem

A first aspect of the present invention is a resist underlayer film forming composition for lithography that includes a polymer and a solvent. In the polymer, diphenyl sulfone or a derivative thereof is introduced in the main chain of the polymer through an ether bond. Here, the ether bond is "—O—". An oxygen atom in the ether bond is usually bonded with a carbon atom to form a C—O bond.

In the resist underlayer film forming composition for lithography, the polymer includes repeating structural units of Formula (1a) and Formula (1b):

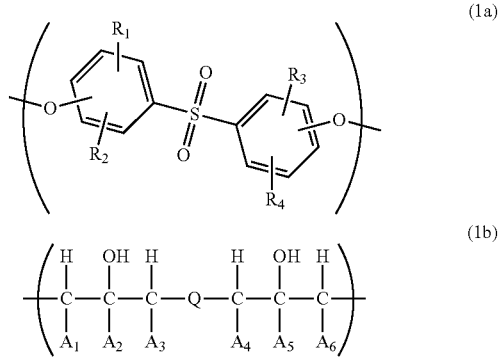

(where each of $R_1$, $R_2$, $R_3$, and $R_4$ is independently a hydrogen atom, an $C_{1-13}$ alkyl group, a hydroxyl group, a methoxy group, a thiol group, an acetyl group, a nitro group, an allyl group, a phenyl group, or a naphthyl group; each of $A_1$, $A_2$, $A_3$, $A_4$, $A_5$, and $A_6$ is independently a hydrogen atom, a methyl group, or an ethyl group; and Q is a divalent organic group between two carbon atoms) as the main chain.

In Formula (1b), Q is Formula (2):

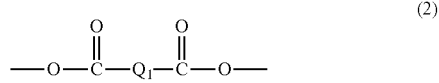

(where $Q_1$ is a $C_{1-10}$ alkylene group, a divalent organic group having a $C_{3-10}$ aliphatic cyclic hydrocarbon ring, a phenylene group, a naphthylene group, or an anthrylene group; each of the phenylene group, the naphthylene group, and the anthrylene group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group).

In Formula (1b), Q is also Formula (3):

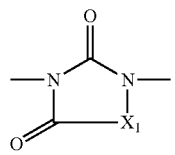

(3)

[where $X_1$ is Formula (4) or Formula (5):

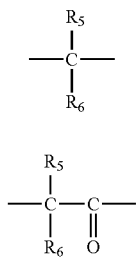

(4)

(5)

(where each of $R_5$ and $R_6$ is independently a hydrogen atom, a $C_{1-6}$ alkyl group, a $C_{3-6}$ alkenyl group, a benzyl group, or a phenyl group; the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group; and $R_5$ and $R_6$ are optionally bonded to each other to form a $C_{3-6}$ ring)]. When $X_1$ is Formula (5), the carbonyl group in Formula (5) bonds to the nitrogen atom in Formula (3).

The repeating structural unit of Formula (1b) optionally further includes Q being the structural unit of Formula (2), in addition to Q being the structural unit of Formula (3).

In Formula (1b), Q is also Formula (6):

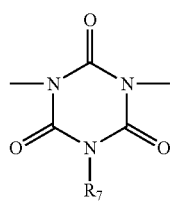

(6)

(where $R_7$ is a $C_{1-6}$ alkyl group, a $C_{3-6}$ alkenyl group, a benzyl group, or a phenyl group; and the phenyl group is optionally substituted with at least one selected from the group consisting of a $C_{1-6}$ alkyl group, a halogen atom, a $C_{1-6}$ alkoxy group, a nitro group, a cyano group, and a $C_{1-6}$ alkylthio group).

The repeating structural unit of Formula (1b) optionally further includes Q being the structural unit of Formula (2), in addition to Q being the structural unit of Formula (6).

The polymer optionally further includes a repeating structural unit of Formula (7).

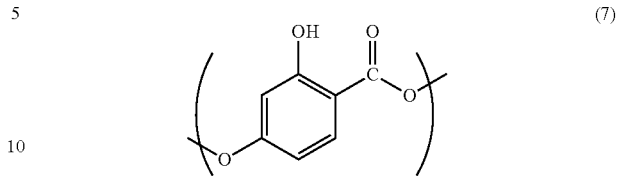

(7)

in addition to the repeating structural units of Formula (1a) and Formula (1b).

In the present invention, examples of the alkyl group include a methyl group, an ethyl group, an isopropyl group, an n-butyl group, and a cyclohexyl group. Examples of the $C_{1-10}$ alkylene group include a methylene group, an ethylene group, an n-propylene group, an n-pentylene group, an n-octylene group, a 2-methylpropylene group, a 1,4-dimethylbutylene group, a cyclopentylene group, a cyclobutylene group, a cyclohexylene group, and a 2-methyl-cyclohexylene group. Examples of the $C_{3-10}$ aliphatic cyclic hydrocarbon ring include a cyclohexane ring and an adamantane ring. Examples of the $C_{1-6}$ alkoxy group include a methoxy group, an ethoxy group, an n-pentyloxy group, an isopropoxy group, and a cyclohexyloxy group. Examples of the $C_{1-6}$ alkylthio group include a methylthio group, an ethylthio group, an n-pentylthio group, an isopropylthio group, and a cyclohexylthio group. Examples of the $C_{3-6}$ alkenyl group include a 2-propenyl group and 3-butenyl group. The alkyl group, the alkylene group, the alkoxy group, and the alkylthio group are not limited to linear groups and may be branched structures or cyclic structures. Examples of the halogen atom include fluorine, chlorine, bromine, and iodine.

The repeating numbers of the repeating structural unit of Formula (1a) and Formula (1b) are, for example, in the range of 10 or more and 10,000 or less.

Examples of the solvent included in the resist underlayer film forming composition of the present invention include propylene glycol monomethyl ether (PGME), propylene glycol monomethyl ether acetate (PGMEA), propylene glycol monopropyl ether, methyl ethyl ketone, ethyl lactate, cyclohexanone, γ-butyrolactone, N-methylpyrrolidone, and a mixture of two or more solvents selected from these solvents. A proportion of the solvent to the resist underlayer film forming composition of the present invention is, for example, 50% by mass or more and 99.5% by mass or less.

A proportion of the polymer in the resist underlayer film forming composition of the present invention to the resist underlayer film forming composition can be, for example, 0.5% by mass or more and 30% by mass or less.

The resist underlayer film forming composition of the present invention optionally includes a cross-linkable compound (a cross-linking agent) and optionally further includes a compound for accelerating the cross-linking reaction, in addition to the polymer and the solvent. When a solid content is defined as components formed by removing the solvent from the composition, the solid content includes the polymer, and additives such as the cross-linkable compound and the compound for accelerating the cross-linking reaction that are added if necessary. A proportion of the polymer in the solid content is, for example, 70% by mass or more and 98% by mass or less. When the additives are not included, the proportion of the polymer in the solid content can be 100% by mass.

The cross-linkable compound is, for example, a nitrogen-containing compound having 2 to 4 nitrogen atoms that are substituted with a methylol group or an alkoxymethyl group, and the compound can be added, for example, in a proportion of 1% by mass or more and 30% by mass or less to the polymer included in the resist underlayer film forming composition of the present invention. Specific examples of the cross-linkable compound include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, and 1,1,3,3-tetrakis(methoxymethyl)urea.

The compound for accelerating the cross-linking reaction is, for example, at least one selected from a sulfonic acid compound and a thermal acid generator. The compound for accelerating the cross-linking reaction can be added in a proportion of, for example, 0.1% by mass or more and 10% by mass or less to the polymer included in the resist underlayer film forming composition of the present invention. Examples of the sulfonic acid compound include p-toluenesulfonic acid, trifluoromethanesulfonic acid, pyridinium p-toluenesulfonate, camphorsulfonic acid, 5-sulfosalicylic acid, 4-chlorobenzenesulfonic acid, 4-hydroxybenzenesulfonic acid, benzenedisulfonic acid, and 1-naphthalenesulfonic acid. Examples of the thermal acid generator include 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate, 3-benzylbenzothiazolium hexafluoroantimonate, 2,4,4,6-tetrabromocyclohexadienone, benzoin tosylate, and 2-nitrobenzyl tosylate.

The resist underlayer film forming composition of the present invention optionally includes a surfactant and/or an adhesion assistant. The surfactant is an additive for improving coating properties to the substrate. Known surfactants such as a nonionic surfactant and a fluorinated surfactant can be used. The surfactant can be added to the resist underlayer film forming composition of the present invention in a proportion of, for example, 0.2% by mass or less. The adhesion assistant is an additive for improving adhesion properties between the resist underlayer film and the substrate or the resist film, and for preventing peeling of the resist film at the time of development after exposure. For example, chlorosilanes, alkoxysilanes, silazanes, silanes, and heterocyclic compounds can be used as the adhesion assistant, and the adhesion assistant can be added to the resist underlayer film forming composition of the present invention in a proportion of, for example, 2% by mass or less.

A second aspect of the present invention is a method for forming a resist pattern for producing a semiconductor device. The method includes: applying the resist underlayer film forming composition of the present invention onto a semiconductor substrate and baking the obtained substance to form a resist underlayer film; forming a resist film on the resist underlayer film; exposing the semiconductor substrate coated with the resist underlayer film and the resist film; and developing the resist film after the exposure.

The exposure performed in the second aspect of the present invention can be performed by using EUV (wavelength 13.5 nm) or an electron beam. "EUV" is an abbreviation of extreme ultraviolet. Both of a positive type resist and a negative type resist can be used for the resist for forming the resist film. A chemically amplified resist that is sensitive to EUV or an electron beam can be used.

Although a representative semiconductor substrate used in the second aspect of the present invention is a silicon wafer, a Silicon on Insulator (SOI) substrate or a compound semiconductor wafer made of such as gallium arsenide (GaAs), indium phosphide (InP), and gallium phosphide (GaP) may be used.

Effects of the Invention

The resist underlayer film forming composition of the present invention includes a polymer in which diphenylsulfone or a derivative thereof is introduced in the main chain through an ether bond. For example, the resist underlayer film forming composition includes a two-dimensional polymer having repeating structural units of Formula (1a) and Formula (1b). As a result, the resist underlayer film having high selectivity of the dry etching rate to the resist film is obtained without decreasing an aromatic ring density. The main chain of the polymer included in the resist underlayer film forming composition of the present invention has a C—O bond (an ether bond) that is cleaved more easily than a C—C bond in dry etching, and thus, the resist underlayer film forming composition of the present invention can form a resist underlayer film having higher dry etching rate than a conventional resist underlayer film forming composition including a polymer such as an acrylic resin or a methacrylic resin.

Introduction of diphenylsulfone or a derivative thereof having benzene rings, which are aromatic rings, in the main chain of the polymer can provide a formed resist underlayer film having a high density and a resist pattern having a desired shape (a cross section in the direction perpendicular to the substrate is a rectangular shape) can be formed.

BEST MODES FOR CARRYING OUT THE INVENTION

The polymer included in the resist underlayer film forming composition of the present invention is a polyaddition reaction product between at least one compound of Formula (8a):

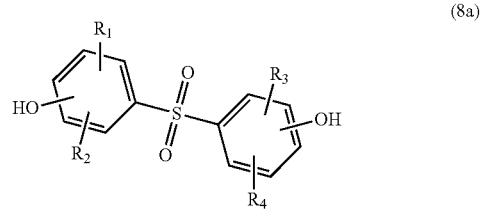

(where each of $R_1$, $R_2$, $R_3$, and $R_4$ is independently a hydrogen atom, an $C_{1-13}$ alkyl group, a hydroxyl group, a methoxy group, a thiol group, an acetyl group, a nitro group, an allyl group, a phenyl group, or a naphthyl group) and at least one compound of Formula (8b):

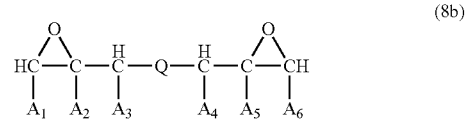

(where each of $A_1$, $A_2$, $A_3$, $A_4$, $A_5$, and $A_6$ is independently a hydrogen atom, a methyl group, or an ethyl group; and Q is a divalent organic group between two carbon atoms).

More specifically, at least one compound of Formula (8a) and at least one compound of Formula (8b) are dissolved in an organic solvent so as to be in an adequate molar ratio, and thereafter polymerized in the presence of a catalyst that activates epoxy groups to obtain a polymer having repeating structural units of Formula (1a) and Formula (1b). Bisphenol S is one example of a compound of Formula (8a). Examples of the catalyst that activates epoxy groups include quaternary phosphonium salts such as ethyltriphenylphosphonium bromide and quaternary ammonium salts such as benzyltriethylammonium chloride. The catalyst can be used in an adequate amount selected from a range of 0.1% by mass to 10% by mass to the total mass of the compound of Formula (8a) and the Formula (8b). Optimum conditions of temperature and time in the polymerization reaction can be selected from ranges of 80° C. to 160° C. and 2 hours to 50 hours.

In Formula (8b), Q is, for example, Formula (9):

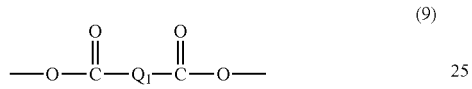

(9)

(where $Q_1$ is a $C_{1-10}$ alkylene group, a divalent organic group having a $C_{3-10}$ aliphatic cyclic hydrocarbon ring, a phenylene group, a naphthylene group, or an anthrylene group; each of the phenylene group, the naphthylene group, and the anthrylene group is optionally substituted with at least one group selected from the group consisting of a $C_{1-6}$ alkyl group, a halogen atom, a $C_{1-6}$ alkoxy group, a nitro group, a cyano group, and a $C_{1-6}$ alkylthio group).

The compound of Formula (8b) is, for example, Formula (10):

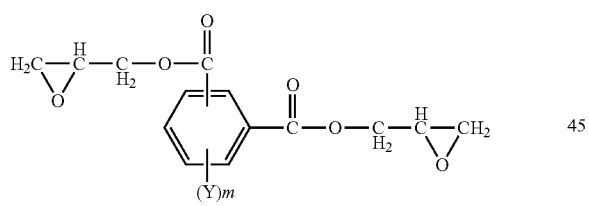

(10)

(where Y is a $C_{1-6}$ alkyl group, a halogen atom, a $C_{1-6}$ alkoxy group, a nitro group, a cyano group, or a $C_{1-6}$ alkylthio group; m is an integer of 0 to 4; and when m is 2 to 4, Ys are the same as or different from each other). The case of m being 0 means that there are no substituents represented by Y.

In Formula (8b), Q is also Formula (11):

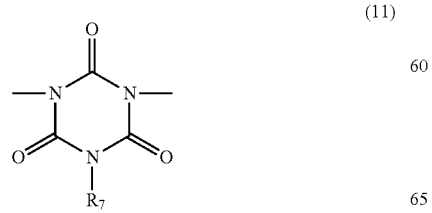

(11)

(where $R_7$ is a $C_{1-6}$ alkyl group, a $C_{3-6}$ alkenyl group, a benzyl group, or a phenyl group; and the phenyl group is optionally substituted with at least one group selected from the group consisting of a $C_{1-6}$ alkyl group, a halogen atom, a $C_{1-6}$ alkoxy group, a nitro group, a cyano group, and a $C_{1-6}$ alkylthio group).

Specific examples of the compounds of Formula (8b) are shown in Formula (12) to Formula (20).

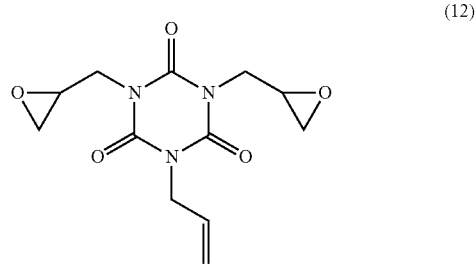

(12)

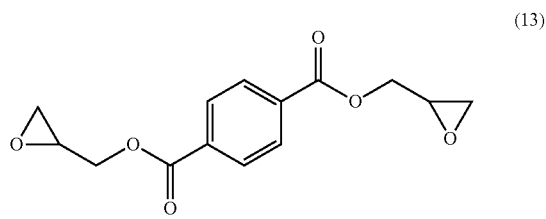

(13)

(14)

(15)

(16)

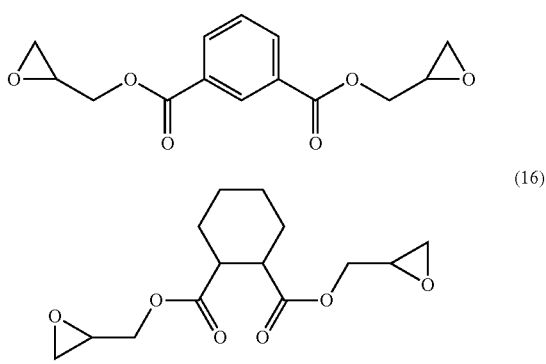

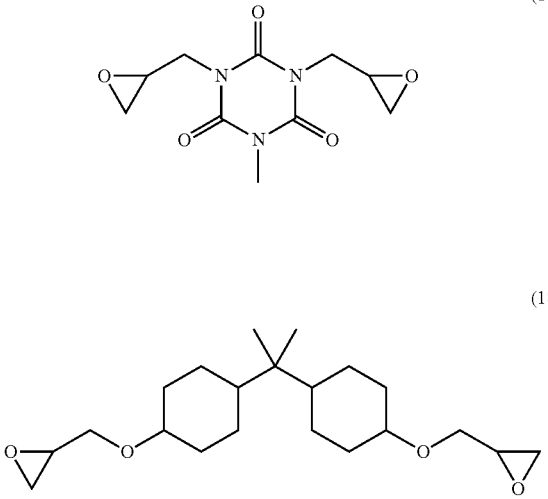
(17)
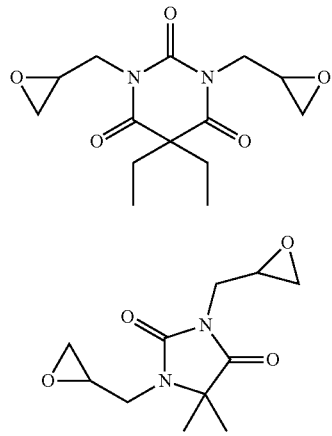
(19)
(18)
(20)
The repeating structural units of the polymer included in the resist underlayer film forming composition of the present invention are exemplified in Formula (21) to Formula (25).
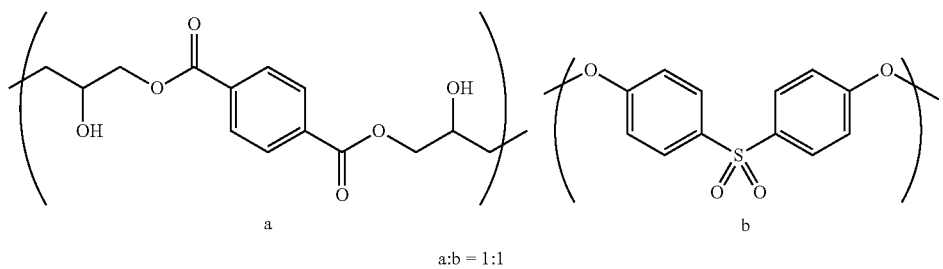
(21)
a:b = 1:1
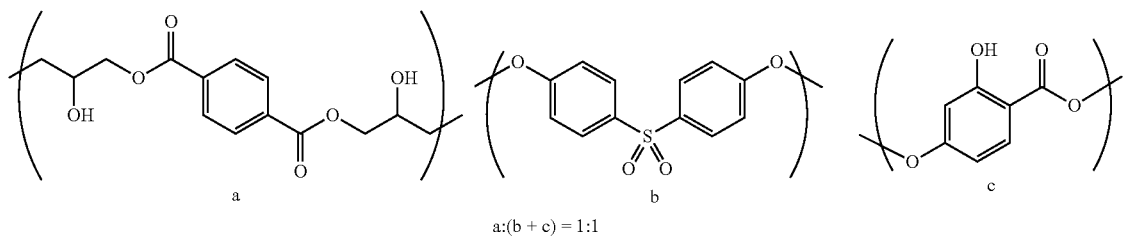
(22)
a:(b + c) = 1:1
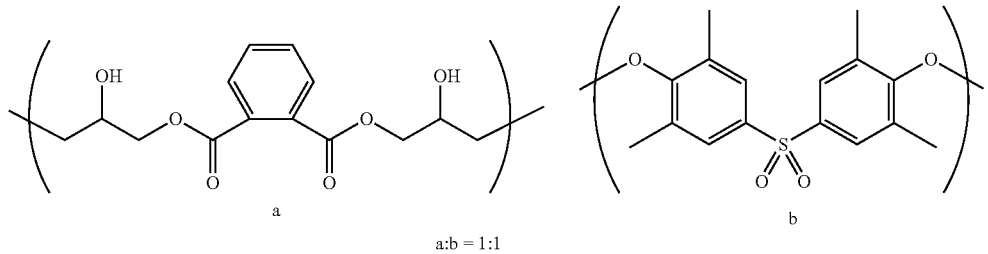
(23)
a:b = 1:1
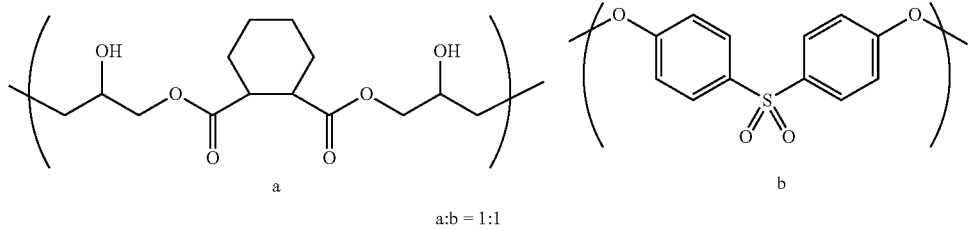
(24)
a:b = 1:1

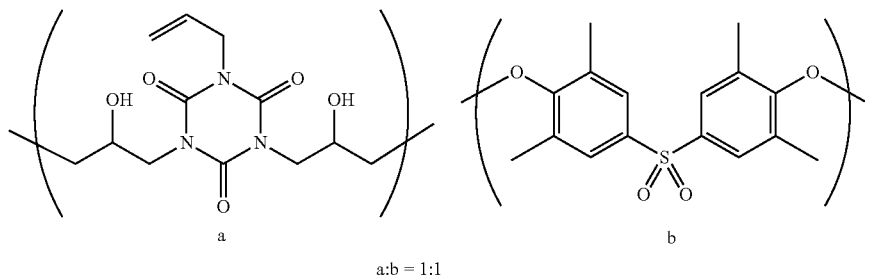

(25)

a:b = 1:1

For example, the polymer having the repeating structural unit of Formula (21) is obtained by polymerizing the compound of Formula (8a) and the compound of Formula (8b) (the compound of Formula (10)). A polymer having the repeating structural unit of Formula (22) is obtained by polymerizing the compound of Formula (8a), the compound of Formula (8b) (the compound of Formula (10)), and 2,4-dihydroxybenzoic acid.

A molar ratio of the structural unit of a and the structural unit of b in Formula (21) is 1:1. A molar ratio of the structural unit of a, the structural unit of b, and the structural unit c in Formula (22) satisfies a relation of a:(b+c)=1:1. A molar ratio of the structural unit of a and the structural unit of b in Formula (23) is 1:1. A molar ratio of the structural unit of a and the structural unit of b in Formula (24) is 1:1. A molar ratio of the structural unit of a and the structural unit of b in Formula (25) is 1:1.

Hereinafter, the present invention is specifically described by Synthesis Examples and Examples. However, the present invention is not limited to the description in Synthesis Examples and Examples described below.

EXAMPLES

Weight average molecular weights shown in Synthesis Example 1 to Synthesis Example 3 described below are based on measurements by a gel permeation chromatography (hereinafter, abbreviated to GPC in this specification). The GPC system manufactured by Tosoh Corporation was used for the measurement and measurement conditions are as follows.
GPC Column: Shodex [registered trademark]/Asahipak [registered trademark] (Showa Denko K. K.)
Column temperature: 40° C.
Solvent: N,N-dimethyl formamide (DMF)
Flow rate: 0.6 ml/minute
Standard sample: Polystyrene (Tosoh Corporation)
Detector: RI Synthesis Example 1

In 70.90 g of propylene glycol monomethyl ether, 10.00 g of diglycidyl terephthalate (manufactured by Nagase ChemteX Corporation, trade name: Denacol [registered trademark] EX711), 4.38 g of bisphenol S, 2.68 g of 2,4-dihydroxybenzoic acid, and 0.65 g of ethyltriphenylphosphonium bromide were dissolved and then the mixture was reacted at 130° C. for 4 hours to give a polymer solution. The obtained polymer corresponded to the polymer of Formula (22) (a:b:c=10:5:5 (molar ratio)). By subjecting the obtained polymer solution to GPC analysis, it was revealed that the weight average molecular weight was 5,300 in terms of standard polystyrene.

Synthesis Example 2

In 68.21 g of propylene glycol monomethyl ether, 10.00 g of diglycidyl terephthalate (manufactured by Nagase ChemteX Corporation, trade name: Denacol [registered trademark] EX711), 2.63 g of bisphenol S, 3.78 g of 2,4-dihydroxybenzoic acid, and 0.65 g of ethyltriphenylphosphonium bromide were dissolved and then the mixture was reacted at 130° C. for 4 hours to give a polymer solution. The obtained polymer corresponded to the polymer of Formula (22) (a:b:c=10:3:7 (molar ratio)). By subjecting the obtained polymer solution to GPC analysis, it was revealed that the weight average molecular weight was 4,800 in terms of standard polystyrene.

Synthesis Example 3

In 73.60 g of propylene glycol monomethyl ether, 10.00 g of diglycidyl terephthalate (manufactured by Nagase ChemteX Corporation, trade name: Denacol [registered trademark] EX711), 6.13 g of bisphenol S, 1.62 g of 2,4-dihydroxybenzoic acid, and 0.65 g of ethyltriphenylphosphonium bromide were dissolved and then the mixture was reacted at 130° C. for 4 hours to give a polymer solution. The obtained polymer corresponded to the polymer of Formula (22) (a:b:c=10:7:3 (molar ratio)). By subjecting the obtained polymer solution to GPC analysis, it was revealed that the weight average molecular weight was 4,800 in terms of standard polystyrene.

Synthesis Example 4

In 112.21 g of propylene glycol monomethyl ether, 15.00 g of monoallyl diglycidyl isocyanurate (manufactured by Shikoku Chemicals Corporation), 7.46 g of bisphenol S, 4.59 g of 2,4-dihydroxybenzoic acid, and 1.01 g of ethyltriphenylphosphonium bromide were dissolved and then the mixture was reacted at 130° C. for 4 hours to give a polymer solution. By subjecting the obtained polymer solution to GPC analysis, it was revealed that the weight average molecular weight was 4,500 in terms of standard polystyrene.

Synthesis Example 5

In 107.62 g of propylene glycol monomethyl ether, 15.00 g of monoallyl diglycidyl isocyanurate (manufactured by Shikoku Chemicals Corporation), 4.47 g of bisphenol S, 6.43 g of 2,4-dihydroxybenzoic acid, and 1.00 g of ethyltriphenylphosphonium bromide were dissolved and then the mixture was reacted at 130° C. for 4 hours to give a polymer solution. By subjecting the obtained polymer solution to GPC analysis, it was revealed that the weight average molecular weight was 5,000 in terms of standard polystyrene.

Example 1

To 10 g of a solution containing 2 g of the polymer obtained in Synthesis Example 1, 0.5 g of tetramethoxymethylglycoluril (manufactured by Nihon Cytec Industries Inc., trade name: Powderlink [registered trademark] 1174) and 0.05 g of pyridinium-p-toluenesulfonate were mixed, and the mixture was dissolved in 35.4 g of propylene glycol monomethyl ether and 18.6 g of ethyl lactate to prepare a solution. Subsequently, the solution was filtered using a polyethylene microfilter having a pore size of 0.10 μm and further filtered using a polyethylene microfilter having a pore size of 0.05 μm to prepare a resist underlayer film forming composition.

Example 2

To 10 g of a solution containing 2 g of the polymer obtained in Synthesis Example 2, 0.5 g of tetramethoxymethylglycoluril (manufactured by Nihon Cytec Industries Inc., trade name: Powderlink [registered trademark] 1174) and 0.05 g of pyridinium-p-toluenesulfonate were mixed, and the mixture was dissolved in 35.4 g of propylene glycol monomethyl ether and 18.6 g of ethyl lactate to prepare a solution. Subsequently, the solution was filtered using a polyethylene microfilter having a pore size of 0.10 μm and further filtered using a polyethylene microfilter having a pore size of 0.05 μm to prepare a resist underlayer film forming composition.

Example 3

To 10 g of the solution containing 2 g of the polymer obtained in Synthesis Example 3, 0.5 g of tetramethoxymethylglycoluril (manufactured by Nihon Cytec Industries Inc., trade name: Powderlink [registered trademark] 1174) and 0.05 g of pyridinium-p-toluenesulfonate were mixed, and the mixture was dissolved in 35.4 g of propylene glycol monomethyl ether and 18.6 g of ethyl lactate to prepare a solution. Subsequently, the solution was filtered using a polyethylene microfilter having a pore size of 0.10 μm and further filtered using a polyethylene microfilter having a pore size of 0.05 μm to prepare a resist underlayer film forming composition.

Example 4

To 10 g of the solution containing 2 g of the polymer obtained in Synthesis Example 4, 0.5 g of tetramethoxymethylglycoluril (manufactured by Nihon Cytec Industries Inc., trade name: Powderlink [registered trademark] 1174) and 0.03 g of pyridinium-p-toluenesulfonate were mixed, and the mixture was dissolved in 34.5 g of propylene glycol monomethyl ether and 18.2 g of ethyl lactate to prepare a solution. Subsequently, the solution was filtered using a polyethylene microfilter having a pore size of 0.10 μm and further filtered using a polyethylene microfilter having a pore size of 0.05 μm to prepare a resist underlayer film forming composition.

Example 5

To 10 g of the solution containing 2 g of the polymer obtained in Synthesis Example 5, 0.5 g of tetramethoxymethylglycoluril (manufactured by Nihon Cytec Industries Inc., trade name: Powderlink [registered trademark] 1174) and 0.03 g of pyridinium-p-toluenesulfonate were mixed, and the mixture was dissolved in 34.5 g of propylene glycol monomethyl ether and 18.2 g of ethyl lactate to prepare a solution. Subsequently, the solution was filtered using a polyethylene microfilter having a pore size of 0.10 μm and further filtered using a polyethylene microfilter having a pore size of 0.05 μm to prepare a resist underlayer film forming composition.

Comparative Example 1

A resist underlayer film forming composition containing copolymer of Formula (26) as a polymer and further containing a cross-linking agent of Formula (27) and pyridinium-p-toluenesulfonate as additives was prepared.

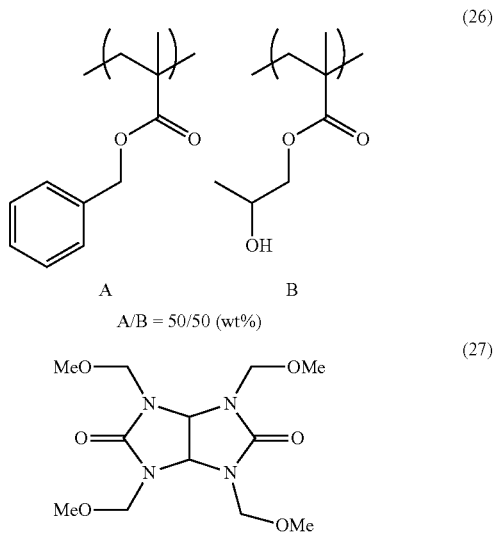

[Dissolution Test in Resist Solvent]

Each of the resist underlayer film forming compositions of the present invention prepared in Example 1 to Example 5 was applied onto a silicon wafer using a spinner (spin coating). The coated silicon wafer was heated on a hot plate at 205° C. for 1 minute to form a resist underlayer film (a film thickness of 0.10 μm). The resist underlayer film was immersed in ethyl lactate and propylene glycol monomethyl ether that are used as a solvent for a resist solution. It was ascertained that the resist underlayer films were insoluble in each solvent.

[Intermixing Test with Resist]

Each of the resist underlayer film forming compositions of the present invention prepared in Example 1 to Example 5 was applied onto a silicon wafer using a spinner. The coated silicon wafer was heated on a hot plate at 205° C. for 1 minute to form a resist underlayer film (a film thickness of 0.10 μm).

A commercially available resist solution (manufactured by The Dow Chemical Company, trade name: UV113) was applied onto an upper layer of the resist underlayer film using a spinner. The coated sample was heated on a hot plate at 120° C. for 1 minute to form a resist film and the resist film was exposed using an exposure device. After the exposure, post exposure bake (PEB) was carried out at 115° C. for 1.5 minutes. After development and rinse treatment of the resist film were carried out, the film thickness of the resist underlayer film was measured. It was ascertained that intermixing between the resist underlayer film obtained from the resist underlayer film forming composition prepared in Example 1 to Example 3 and the resist film did not occur.

[Measurement of Dry Etching Rate]

Each of the resist underlayer film forming compositions of the present invention prepared in Example 1 to Example 5 and the resist underlayer film forming composition described in Comparative example 1 was applied onto a silicon wafer using a spinner. The coated silicon wafer was heated on a hot plate at 205° C. for 1 minute to form a resist underlayer film. A dry etching rate was measured using RIE system ES401 manufactured by Nippon Scientific Co., Ltd. under condition of using $CF_4$ as dry etching gas.

A resist solution (manufactured by Sumitomo Chemical Company, Limited, trade name PAR710) was applied onto a silicon wafer using a spinner to form a resist film in a similar method to the method described above. A dry etching rate was measured using RIE system ES401 manufactured by Nippon Scientific Co., Ltd. under condition of using $CF_4$ as dry etching gas.

Dry etching rates between each of the six resist underlayer films obtained from the resist underlayer film forming compositions in Example 1 to Example 5 and Comparative Example 1 and the resist film obtained from the resist solution manufactured by Sumitomo Chemical Company, Limited were compared. A ratio of the dry etching rate of each resist underlayer film to the dry etching rate of the resist film (selectivity of dry etching rate) is listed in Table 1.

TABLE 1

|  | Selectivity of dry etching rate |
| --- | --- |
| Example 1 | 1.28 |
| Example 2 | 1.33 |
| Example 3 | 1.22 |
| Example 4 | 1.54 |
| Example 5 | 1.59 |
| Comparative Example 1 | 1.10 |

The resist underlayer film obtained from the resist underlayer film forming composition according to the present invention has high selectivity of dry etching rate to the resist film, and has higher selectivity of dry etching rate than the resist underlayer film in Comparative Example 1. As a result, compared with the resist underlayer film in Comparative Example, the resist underlayer film of the present invention can reduce the time required for removal by dry etching. An undesired phenomenon in which the thickness of the resist film on the resist underlayer film is decreased with removal of the resist underlayer film by dry etching can be suppressed.

[Formation of Resist Pattern]

On a silicon wafer, each of the resist underlayer film forming compositions of the present invention prepared in Example 1 was applied by spin-coating and the coated wafer was heated at 205° C. for 1 minute to form a resist underlayer film. On the resist underlayer film, an EUV resist solution (a methacrylate resin-based resist) was applied by spin-coating and the coated wafer was heated to form a resist film. Exposure was carried out using an EUV exposure device (manufactured by ASML, EUV-ADT) under conditions of NA=0.25 and σ=0.5. After the exposure, PEB was carried out. Subsequently, the sample was cooled on a cooling plate to room temperature, and subjected to development and rinse treatment to form a resist pattern. Evaluation was conducted to determine whether 30 nm line-and-space patterns were formed or not and whether pattern line edge roughness (LER) was small or large by observation of the pattern from above.

As Comparative Example 2 a case of using a substrate made by applying HMDS (hexamethyldisilazane) treatment to a silicon substrate, instead of forming a resist underlayer film, was also tested in a similar way.

In this specification, in a line pattern of the line and space, the case that a cross section in the direction perpendicular to the substrate is a rectangular shape is evaluated as "good", and the case that the cross section is a taper (a trapezoid) or a tailed shape is evaluated as "acceptable", while the case that a pattern is collapsed or the line and space is not formed due to insufficient resolution is evaluated as "unacceptable".

The measurement of LER is carried out using a Critical Dimension Scanning Electron Microscopy (CD-SEM). A pattern edge position is two-dimensionally detected from above and fluctuation of the position is quantified as LER. Specifically, using a white bandwidth detected by CD-SEM, length of line width at a part of 70% height from the bottom part of the pattern to the upper face was measured at 400 points and 3σ calculated from the values of length was determined as the LER value.

TABLE 2

|  | 30 nm Line and space formation | LER (nm) 30 nm pattern |
| --- | --- | --- |
| Example 1 | good | 3.9 |
| Comparative Example 2 | acceptable | >4.5 |

As listed in Table 2, it was ascertained that when the resist underlayer film forming composition prepared in Example 1 of the present invention is used, the value of LER is small compared with the value of LER in Comparative Example 2 and pattern dimension accuracy in the manufacturing process is high. The value of LER is usually required to be 4.0 nm or less. In Table 2, ">4.5" means that the LER value is higher than 4.5.

The invention claimed is:
1. A resist underlayer film forming composition for lithography comprising:
a polymer; and
a solvent, wherein
in the polymer, diphenyl sulfone or a derivative thereof is introduced in the main chain of the polymer through an ether bond, and
the polymer includes repeating structural units of Formula (1a) and Formula (1b):

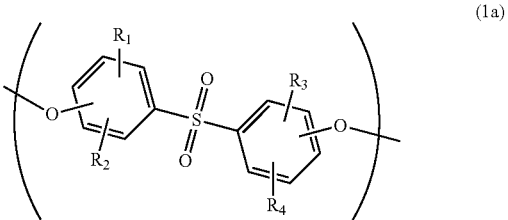

(1a)

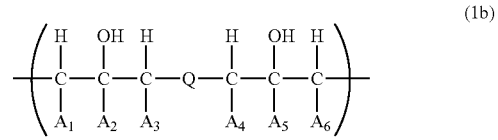

(1b)

(where each of $R_1$, $R_2$, $R_3$, and $R_4$ is independently a hydrogen atom, an $C_{1-13}$ alkyl group, a hydroxyl group, a methoxy group, a thiol group, an acetyl group, a nitro group, an allyl group, a phenyl group, or a naphthyl group; each of $A_1$, $A_2$, $A_3$, $A_4$, $A_5$, and $A_6$ is independently a hydrogen atom, a methyl group, or an ethyl group; and Q is a divalent organic group between two carbon atoms)

as the main chain and further a repeating structural unit of Formula (7):

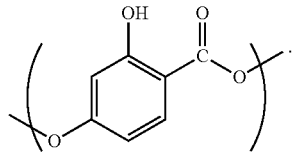
(7)

2. The resist underlayer film forming composition for lithography according to claim 1, further comprising a cross-linkable compound.

3. The resist underlayer film forming composition for lithography according to claim 2, further comprising a compound for accelerating a cross-linking reaction.

4. The resist underlayer film forming composition for lithography according to claim 3, wherein the compound for accelerating the cross-linking reaction is at least one selected from a sulfonic acid compound and a thermal acid generator.

5. The resist underlayer film forming composition for lithography according to claim 2, wherein the cross-linkable compound is a nitrogen-containing compound having 2 to 4 nitrogen atoms that are substituted with a methylol group or an alkoxymethyl group.

6. A resist underlayer film forming composition for lithography comprising:

a polymer; and a solvent, wherein in the polymer, diphenyl sulfone or a derivative thereof is introduced in the main chain of the polymer through an ether bond, and the polymer includes repeating structural units of Formula (1a) and Formula (1b):

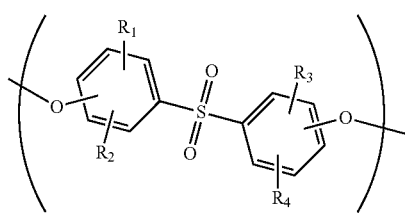
(1a)

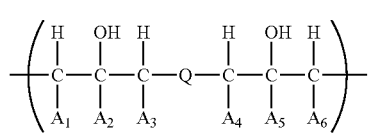
(1b)

(where each of $R_1$, $R_2$, $R_3$, and $R_4$ is independently a hydrogen atom, an alkyl group, a hydroxyl group, a methoxy group, a thiol group, an acetyl group, a nitro group, an allyl group, a phenyl group, or a naphthyl group; each of $A_1$, $A_2$, $A_3$, $A_4$, $A_5$, and $A_6$ is independently a hydrogen atom, a methyl group, or an ethyl group; and Q is a divalent organic group between two carbon atoms), wherein in Formula (1b), Q is Formula (2):

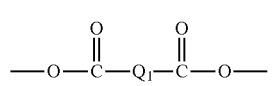
(2)

(where $Q_1$ is a single phenylene group, optionally substituted with at least one group selected from the group consisting of a $C_{1-6}$ alkyl group, a halogen atom, a $C_{1-6}$ alkoxy group, a nitro group, a cyano group, and a $C_{1-6}$ alkylthio group).

7. A resist underlayer film forming composition for lithography comprising:

a polymer; and a solvent, wherein in the polymer, diphenyl sulfone or a derivative thereof is introduced in the main chain of the polymer through an ether bond, and the polymer is a polyaddition reaction product between at least one compound of Formula (8a):

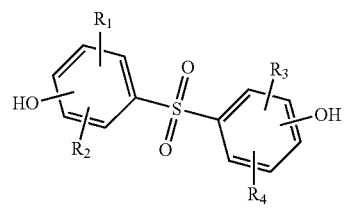
(8a)

(where each of $R_1$, $R_2$, $R_3$, and $R_4$ is independently a hydrogen atom, an $C_{1-13}$ alkyl group, a hydroxyl group, a methoxy group, a thiol group, an acetyl group, a nitro group, an allyl group, a phenyl group, or a naphthyl group)

and at least one compound of Formula (8b):

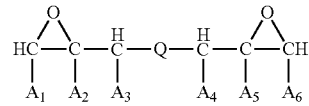
(8b)

(where each of $A_1$, $A_2$, $A_3$, $A_4$, $A_5$, and $A_6$ is independently a hydrogen atom, a methyl group, or an ethyl group; and Q is a divalent organic group of Formula (9):

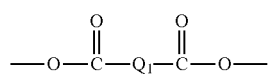
(9)

(where $Q_1$ is a $C_{1-10}$ alkylene group, a divalent organic group having a $C_{3-10}$ aliphatic cyclic hydrocarbon ring, a phenylene group, a naphthylene group, or an anthrylene group; each of the phenylene group, the naphthylene group, and the anthrylene group is optionally substituted with at least one group selected from the group consisting of a $C_{1-6}$ alkyl group, a halogen atom, a $C_{1-6}$ alkoxy group, a nitro group, a cyano group, and a $C_{1-6}$ alkylthio group)).

8. The resist underlayer film forming composition for lithography according to claim 7, wherein the compound of Formula (8b) is Formula (10):
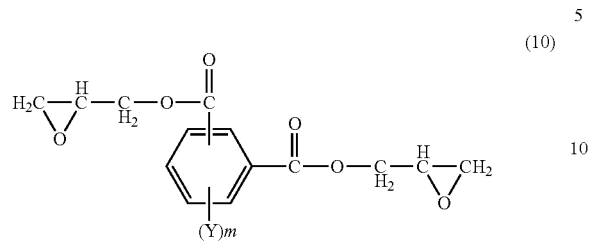
(where Y is a $C_{1-6}$ alkyl group, a halogen atom, a $C_{1-6}$ alkoxy group, a nitro group, a cyano group, or a $C_{1-6}$ alkylthio group; m is an integer of 0 to 4; and when m is 2 to 4, Ys are the same as or different from each other).
* * * * *